(12) United States Patent
Honda et al.

(10) Patent No.: US 11,973,310 B2
(45) Date of Patent: Apr. 30, 2024

(54) LIGHT SOURCE UNIT AND THERMALLY-ASSISTED MAGNETIC HEAD

(71) Applicants: SAE Magnetics (H.K.) Ltd., Hong Kong (CN); HEADWAY TECHNOLOGIES, INC., Milpitas, CA (US)

(72) Inventors: Takashi Honda, Hong Kong (CN); Kowang Liu, Milpitas, CA (US); Kwun Pan Ng, Hong Kong (CN); Makoto Kawato, Hong Kong (CN)

(73) Assignees: SAE MAGNETICS (H.K.) LTD., Hong Kong (CN); HEADWAY TECHNOLOGIES, INC., Milpitas, CA (US)

( * ) Notice: Subject to any disclaimer, the term of this patent is extended or adjusted under 35 U.S.C. 154(b) by 964 days.

(21) Appl. No.: 16/505,964

(22) Filed: Jul. 9, 2019

(65) Prior Publication Data
US 2021/0013695 A1   Jan. 14, 2021

(51) Int. Cl.
  H01S 5/026 (2006.01)
  G11B 5/31 (2006.01)
  H01S 5/02 (2006.01)
  H01S 5/0237 (2021.01)
  G11B 5/00 (2006.01)
  H01S 5/024 (2006.01)

(52) U.S. Cl.
  CPC ........... *H01S 5/0216* (2013.01); *G11B 5/314* (2013.01); *H01S 5/0237* (2021.01); *H01S 5/0261* (2013.01); *G11B 2005/0021* (2013.01); *H01S 5/02453* (2013.01)

(58) Field of Classification Search
  None
  See application file for complete search history.

(56) References Cited

U.S. PATENT DOCUMENTS

| 4,296,309 A | * | 10/1981 | Shinmi | H01C 7/006 347/205 |
| 6,493,183 B1 | * | 12/2002 | Kasiraj | G11B 5/127 360/125.74 |

(Continued)

FOREIGN PATENT DOCUMENTS

| JP | 2000101143 A | * | 4/2000 |
| JP | 2001267639 A | * | 9/2001 |

*Primary Examiner* — Tod T Van Roy
(74) *Attorney, Agent, or Firm* — NIXON & VANDERHYE, P.C.

(57) ABSTRACT

A light source unit for thermally-assisted magnetic head includes a substrate member having a first bonding surface; a light source assembly attached on the first bonding surface of the substrate member and having a second bonding surface; and a heater circuit assembly formed between the substrate member and the light source assembly, the heater circuit assembly having a heater formed on the substrate member and two leads connected at two ends of the heater, the lead being thicker than the heater, thereby a distance between the heater and the second bonding surface is farther than that between the lead and the second bonding surface. The light source unit can reduce mechanical stress and thermal conduction between a light source assembly and a substrate member, thereby improving the performance of the light source assembly and the heater.

8 Claims, 9 Drawing Sheets

(56) References Cited

U.S. PATENT DOCUMENTS

| | | | | |
|---|---|---|---|---|
| 6,999,277 | B2* | 2/2006 | Fontana, Jr. | G11B 5/127 360/123.52 |
| 7,239,481 | B2* | 7/2007 | Lille | G11B 5/314 360/119.09 |
| 7,961,769 | B2* | 6/2011 | Fujiwara | B82Y 20/00 372/50.12 |
| 8,054,583 | B2* | 11/2011 | Zheng | G11B 5/6064 360/234.4 |
| 8,515,219 | B2* | 8/2013 | Abe | H01S 5/02325 385/14 |
| 8,957,692 | B2* | 2/2015 | Shimazawa | G11B 5/3173 324/755.05 |
| 9,123,362 | B1* | 9/2015 | Wang | G11B 5/6088 |
| 9,666,218 | B1* | 5/2017 | Honda | G11B 5/314 |
| 10,566,013 | B1* | 2/2020 | Honda | G11B 5/012 |
| 10,783,918 | B2* | 9/2020 | Wessel | G11B 5/012 |
| 10,826,270 | B2* | 11/2020 | Treese | H01S 5/0612 |
| 2001/0024462 | A1* | 9/2001 | Nakahara | H01S 5/0687 372/43.01 |
| 2003/0095736 | A1* | 5/2003 | Kish, Jr. | H01S 5/02415 385/37 |
| 2011/0280512 | A1* | 11/2011 | Abe | H01S 5/02325 385/14 |
| 2017/0194763 | A1* | 7/2017 | Treese | H01S 5/0612 |
| 2020/0111506 | A1* | 4/2020 | Andruet | G11B 5/607 |
| 2021/0013695 | A1* | 1/2021 | Honda | H01S 5/0216 |
| 2021/0383831 | A1* | 12/2021 | Wessel | G11B 13/08 |
| 2022/0069547 | A1* | 3/2022 | Hirokawa | H01S 5/0207 |

* cited by examiner

LIGHT SOURCE UNIT AND THERMALLY-ASSISTED MAGNETIC HEAD

FIELD OF THE INVENTION

The present invention relates to a hard disk drive (HDD) with a thermally-assisted magnetic head and, more particularly, to a stable light source unit for a thermally-assisted magnetic head.

BACKGROUND OF THE INVENTION

HDDs are common information storage devices. With improvements in recording density of magnetic HDDs, there has been a demand for improving the performance of magnetic heads and magnetic recording media. In a magnetic hard disk drive, a magnetic head is embedded in a slider that flies above the surface of a magnetic recording medium.

Recently, a technology so-called thermal assisted magnetic recording (TAMR) has been proposed, and a thermal assisted magnetic head also has been put to use. The technology uses a magnetic recording medium having high coercivity. When writing data, a write magnetic field and heat are applied almost simultaneously to the area of the magnetic recording medium where to write data, so that the area rises in temperature and drops in coercivity for data writing. The area where data is written subsequently falls in temperature and rises in coercivity to increase the thermal stability of magnetization.

Figure 1:
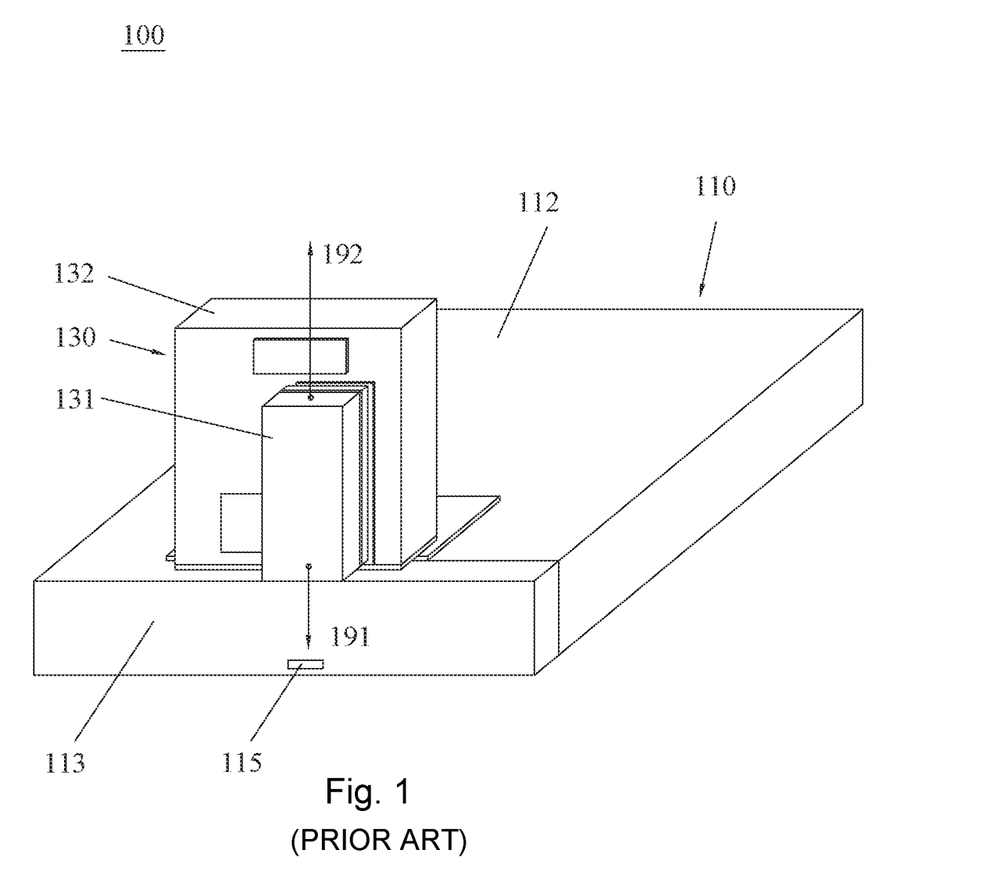
FIG. 1 is a partial exploded perspective view of a conventional thermally-assisted magnetic head.

Commonly, the heat source comes from the thermal assisted magnetic head. FIG. 1 shows a perspective view of a conventional thermal assisted magnetic head 100. The thermal assisted magnetic head 100 includes a slider body 110 having an air bearing surface (ABS) (not shown, under) processed so as to provide an appropriate flying height and a light source unit 130 mounted on the slider body 110. The slider body 110 includes a bottom surface 112 opposite the ABS, a trailing edge 113 where read and write elements 115 are embedded, and a leading edge (not shown, back) opposite the trailing edge 113. The light source unit 130 is mounted on the position where the write elements are embedded via a bonding layer. The light source unit 130 includes a light source 131 located near the write element and a substrate member 132 for supporting the light source 131. The substrate member 132 is bonded to the slider body 110 by using a solder layer, for example. The light source 131 has a laser diode embedded therein which emits a laser light to a portion of the magnetic recording medium, which reduces the medium's coercivity. After that, writing is performed by applying write magnetic field to the heated portion; therefore the writing operation is facilitated.

However, during the bonding process of the substrate member 132 and the light source 131, a large mechanical stress is always generated therebetween to potentially damage or weaker the light source 131, and the temperature of the laser diode is unstable due to large thermal conduction, thus the writing operation on the disk track is unstable.

Thus, it is desired to provide an improved light source unit and a thermally-assisted magnetic head to overcome the above-mentioned drawbacks.

SUMMARY OF THE INVENTION

One objective of the present invention is to provide a light source unit, which reduces mechanical stress and thermal conduction between a light source assembly and a substrate member, thereby improving the performance of the light source assembly and the heater.

Another objective of the present invention is to provide a thermally-assisted magnetic head, which reduces mechanical stress and thermal conduction between a light source assembly and a substrate member, thereby improving the performance of the light source unit and the thermally-assisted magnetic head.

To achieve above objectives, a light source unit for thermally-assisted magnetic head includes:
- a substrate member having a first bonding surface;
- a light source assembly attached on the first bonding surface of the substrate member and having a second bonding surface; and
- a heater circuit assembly formed between the substrate member and the light source assembly, the heater circuit assembly having a heater formed on the substrate member and two leads connected at two ends of the heater, the lead being thicker than the heater, thereby a distance between the heater and the second bonding surface is farther than that between the lead and the second bonding surface.

Preferably, the first bonding surface of the substrate member has a bonding area that is bonded to the light source assembly, and the heater is buried under the light source assembly and located within the bonding area.

Preferably, multiple layers are formed on the substrate member and comprising a base layer, a connection pad layer, an insulation layer, a buffer layer and a first bonding layer with the first bonding surface provided.

As another preferable embodiment, the connection pad layer comprises a heater pad and a heater grounding pad respectively connected with the heater, a first via hole is formed between the insulation layer and the heater pad, a second via hole is formed between the insulation layer and the heater grounding pad, the first lead is connected between the first via hole and the heater, and the second lead is connected between the second via hole and the heater.

Preferably, the insulation layer comprises a first insulation layer and a second insulation layer, and the heater is sandwiched between the first insulation layer and the second insulation layer.

Preferably, the second insulation layer is thicker than the first insulation layer, and thermal conductivity of the second insulation layer is lower than that of the first insulation layer.

Preferably, the first insulation layer is made of SiN or AlN, and the second insulation layer is made of $SiO_2$, SiN or $Al_2O_3$.

Preferably, the heater is made of tungsten or platinum.

Preferably, a second bonding layer is formed on the light source assembly to provide the second bonding surface, and the second bonding layer is thinner than the first bonding layer.

A thermally-assisted magnetic head includes a slider body and the light source unit attached on a surface of the slider body.

In comparison with the prior art, in the light source unit of the present invention, since lead is thicker than the heater, thereby a distance between the heater and the second bonding surface is farther than that between the lead and the second bonding surface. During the assembling between the light source assembly and substrate member, the second bonding surface of the light source assembly is bonded to the substrate member, while the heater will not directly contact with the second bonding surface of the light source assembly. Therefore, less solder material will contact with the surface of the heater, less thermal conduction will be generated between the light source assembly and the heater, thereby preventing the light source assembly from being damaged. Furthermore, less mechanical stress will be generated on the surface of the heater, thereby improving the performance of the heater, and finally improving the performance of the thermally-assisted magnetic head and the disk.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Various preferred embodiments of the invention will now be described with reference to the figures, wherein like reference numerals designate similar parts throughout the various views. As indicated above, the invention is directed to an improved light source unit with.

Figure 2:
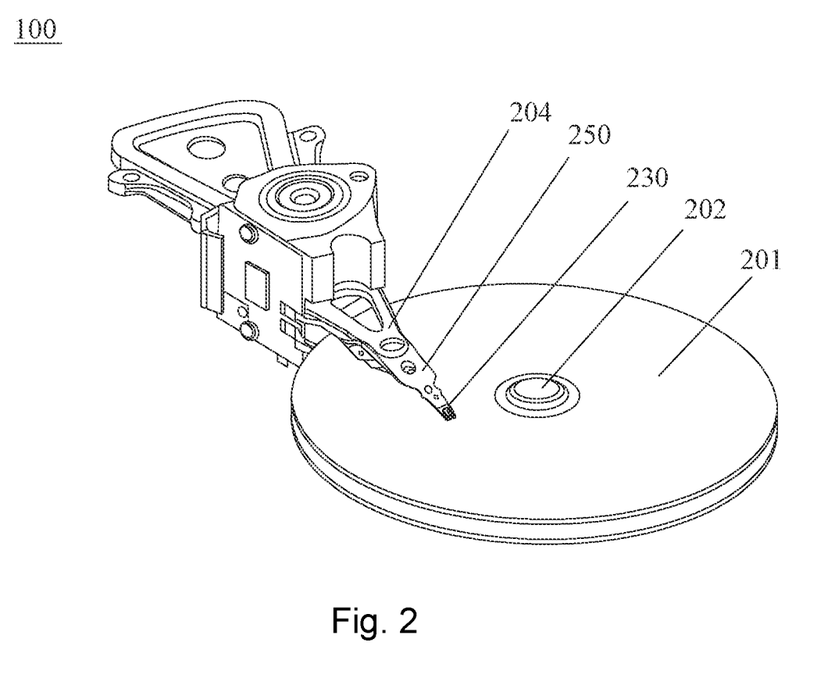
FIG. 2 is a perspective view of a hard disk drive with thermally-assisted magnetic heads according to one embodiment of the present invention.

FIG. 2 is a perspective view of the hard disk drive of the present invention. As shown, a hard disk drive 200 contains a number of rotatable magnetic disks 201 attached to a spindle motor 202, a set of drive arms 204 and HGAs 250 mounted on the ends of the drive arms 204. Typically, a VCM is provided for controlling the motion of the drive arm 204.

Figure 3:
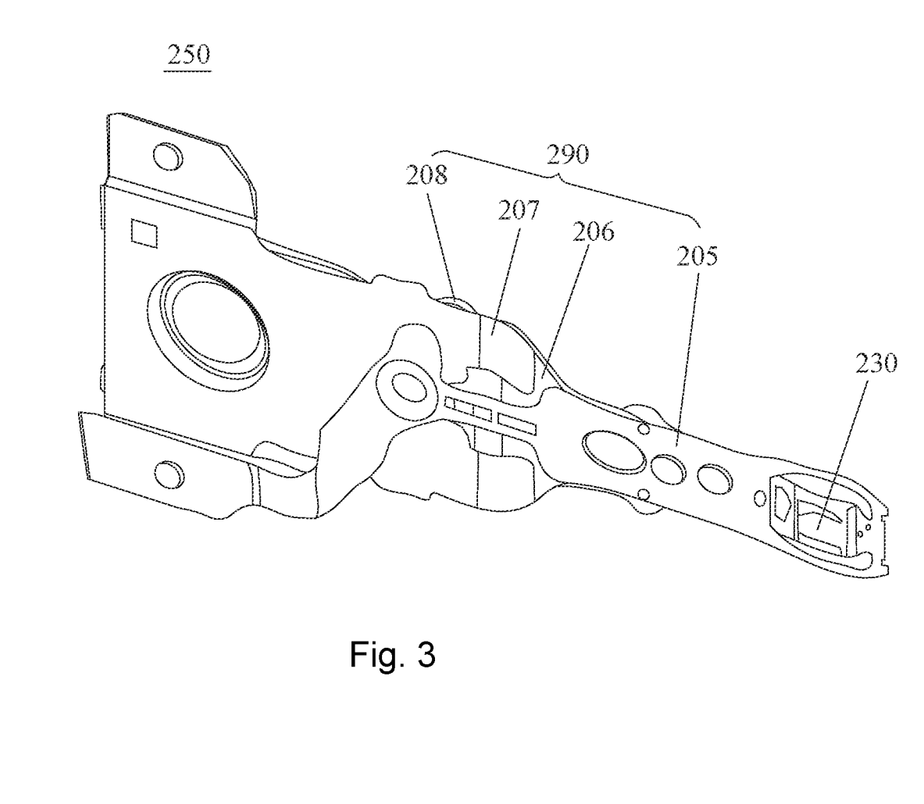
FIG. 3 is a perspective view of a head gimbal assembly with a thermally-assisted magnetic head according to one embodiment of the present invention.

Referring to FIG. 3, the HGA 250 contains a thermally-assisted magnetic head 230 and a suspension 290 for supporting the thermally-assisted magnetic head 230. The suspension 290 includes a load beam 206, a base plate 208, a hinge 207 and a flexure 205, all of which are assembled with each other. The hinge 207 has a mounting hole (not shown) formed thereon to assemble the hinge 207 to the base plate 208. As the main structure of the HGA 250 is known to the persons skilled in the art, thus is omitted here. Specifically, the thermally assisted head 230 is carried on the flexure 205.

Figure 4:
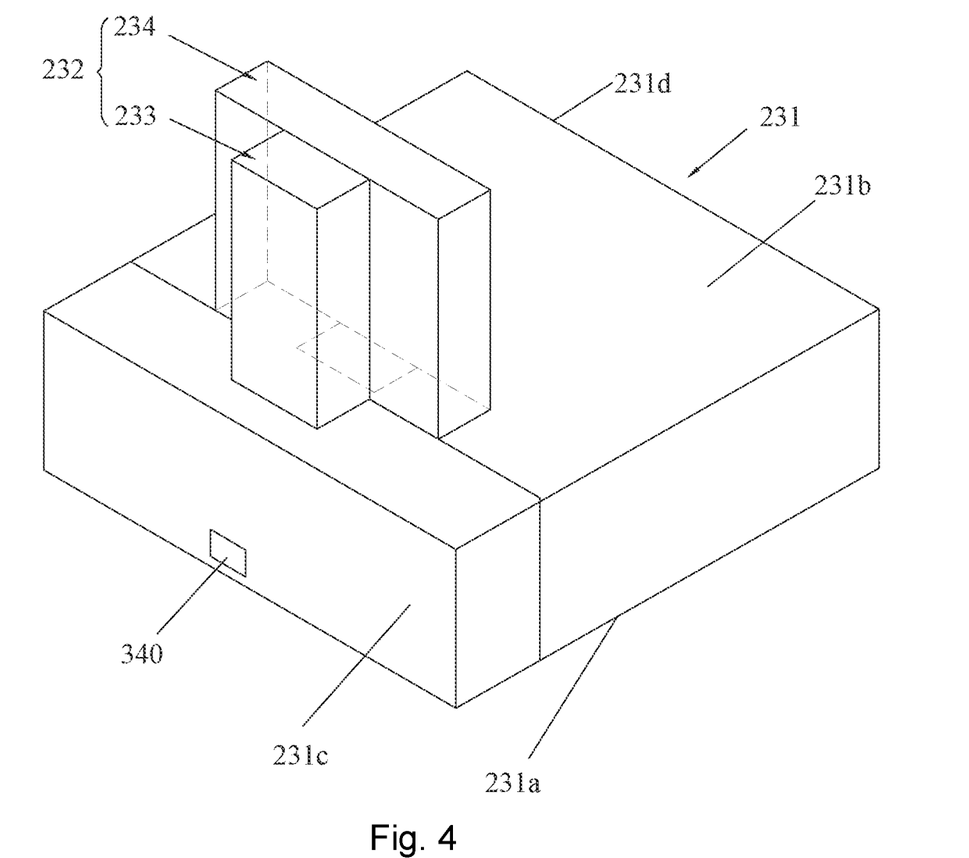
FIG. 4 is a perspective view of a thermally-assisted magnetic head according to one embodiment of the present invention.

Referring to FIG. 4, the thermally-assisted magnetic head 230 according to the present invention is illustrated. The thermally-assisted magnetic head 230 includes a slider body 231 and a light source unit 232 formed on the slider body 231 for thermally assisted magnetic recording. The light source unit 232 includes a light source 233 and a substrate member 234 for supporting the light source 233. In the present embodiment, the slider body 231, the light source 233, and the substrate member 234 are generally rectangular shaped.

As shown, the slider body 231 has an ABS 231a, a bottom surface 231b opposite to the ABS 231a, a trailing edge 231c, a leading edge 231d opposite to the trailing edge 231c, and two side surfaces (not labeled). The ABS 231a facing to the disk is processed so as to provide an appropriate flying height, and a thermally-assisted magnetic head section 340 is embedded in the trailing edge 231c. The trailing edge 231c has multiple bonding pads (not shown) to connect with a suspension 290 of the HGA 250. Specifically, the light source unit 232 is mounted on the bottom surface 231b, for emitting laser light to facilitate writing.

Figure 5A:
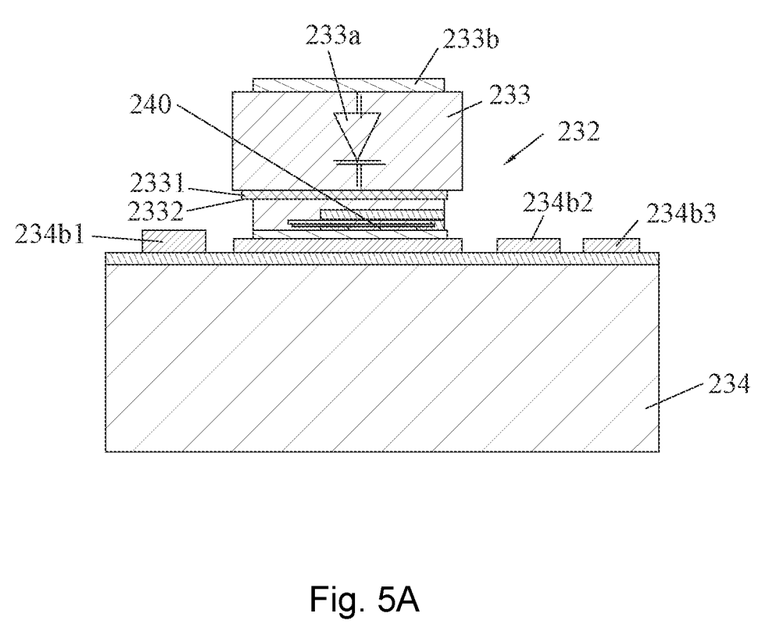
FIG. 5A is a cross section view of a light source unit according to an embodiment of the present invention.

As shown in FIG. 5A, the light source unit 232 includes the substrate member 234 and the light source assembly 233 attached on the substrate member 234 via solders (not shown). Specifically, light source assembly 233 includes a second bonding layer 2331 which provides a second bonding surface 2332. Preferably, the light source 233 has a laser diode 233a embedded therein which is electrically and physically connected with substrate member 234.

As illustrated in FIGS. 5A-5C and 6, the substrate member 234 has a base layer 234a, a connection pad layer 234b, an insulation layer 234c, a buffer layer 234d and a first bonding layer 234e are formed, from bottom to top. Combining with FIG. 6, the substrate member 234 is a wafer made of Si, the base layer 234a is a thermal oxidation layer made of $SiO_2$. The connection pad layer 234b is adapted for arranging pads and leads for electrical connection. A heater circuit assembly is formed between the substrate member 234 and the light source assembly 233, and the heater circuit assembly includes a heater 240 buried in the insulation layer 234c. Preferably, the insulation layer 234c includes a first insulation layer 234c1 and a second insulation layer 234c2, and the heater 240 is sandwiched between the first insulation layer 234c1 and the second insulation layer 234c2. Preferably, the first insulation layer 234c1 is made of AlN, or SiN, and the second insulation layer 234c2 is made of $Al_2O_3$, $SiO_2$, or SiN. The buffer layer 234d may include two or three layers made of Au, Pt or Ta, and the first bonding layer 234e is made of Au or Sn, by means of solder bonding, the light source assembly 233 is bonded with the first bonding layer 234e of the substrate member 234. The topmost layer 234e is provided with a first bonding surface 2341. The light source assembly 233 includes a laser diode 233a embedded therein and electrically connected to the connection pad layer 234b on the substrate member 234, a laser diode pad 233b is formed on the light source assembly 233 for electrical connection. Preferably, the second bonding layer 2331 of the light source assembly 233 is thinner than the first bonding layer 234e (shown in FIG. 6) of the substrate member 234 after assembly. FIG. 7 shows a bonding process of the light source unit 232 according to the present invention.

Figure 5B:
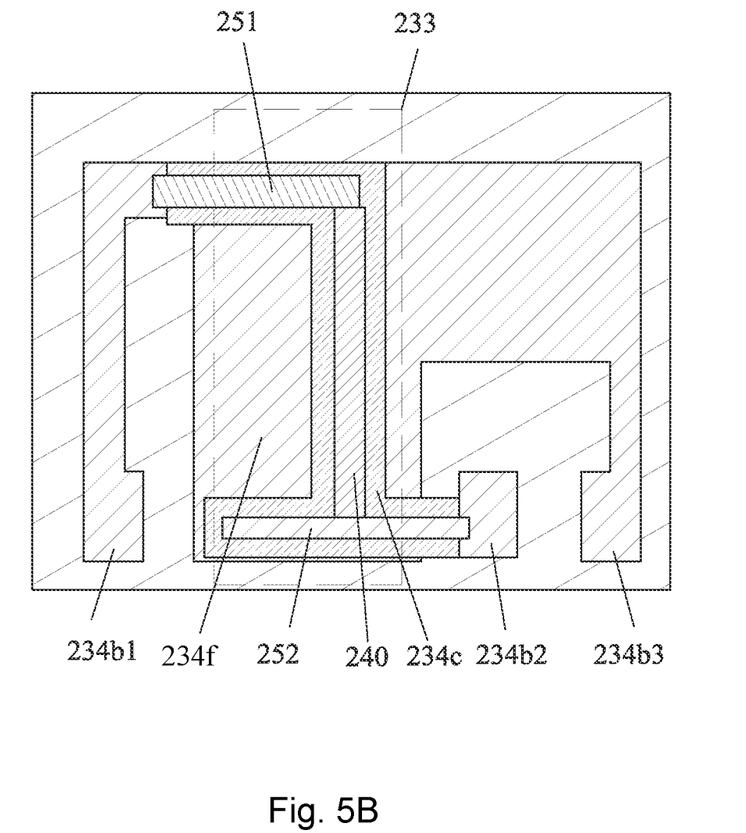
FIG. 5B is a simplified top view of the light source unit of FIG. 5A, showing the layout of the connection pads especially.

In this embodiment, a bonding area 234f is defined on the surface of the substrate member 234, as illustrated in FIG. 5B, that is, the bonding area 234f is that area faces to the bonding position of the light source assembly 233. The heater 240 is buried under the light source assembly 233 and located within the bonding area 234f, that is, the heater 240 is covered under the light source assembly 233. Preferably, the heater 240 is made of tungsten or platinum.

As shown in FIGS. 5A and 5B, the connection pad layer 234b is adapted for arranging pads and leads 251, 252 and includes a heater pad 234b1, a heater grounding pad 234b2 and the laser diode grounding pad 234b3. Specifically, the heater pad 234b1 and the heater grounding pad 234b2 are connected with the heater 240 by means of leads, thereby forming a heater circuit. The laser diode grounding pad 234b3 and the laser diode pad 233b on the light source assembly 233 is connected with the laser diode 233a, thereby forming a laser diode circuit. When the heater circuit and the laser diode circuit are electrified, the heater 240 and the laser diode 233a could be controlled.

Figure 5C:
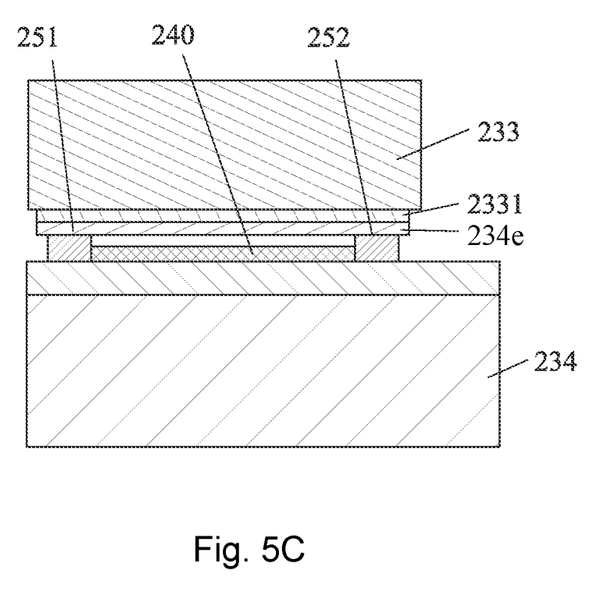
FIG. 5C is a simplified cross section of the light source unit according to an embodiment of the present invention.

More specifically, as illustrated in FIG. 5B-5C, a first lead 251 and a second lead 252 are connected at two ends of the heater 240 along a direction perpendicular to a length direction of the heater 240. Preferably, the first lead 251 and the second lead 252 are parallel to each other. As shown, the connection pad layer 234b includes the heater pad 234b1 and a heater grounding pad 234b2 respectively connected with the heater 240, a first via hole (not shown) is formed between the insulation layer 234c and the heater pad 234b1, a second via hole (not shown) is formed between the insulation layer 234c and the heater grounding pad 234b2, the first lead 251 is connected between the first via hole and the heater 240, and the second lead 252 is connected between the second via hole and the heater 240. In such a way, the heater circuit is established.

Figure 6:
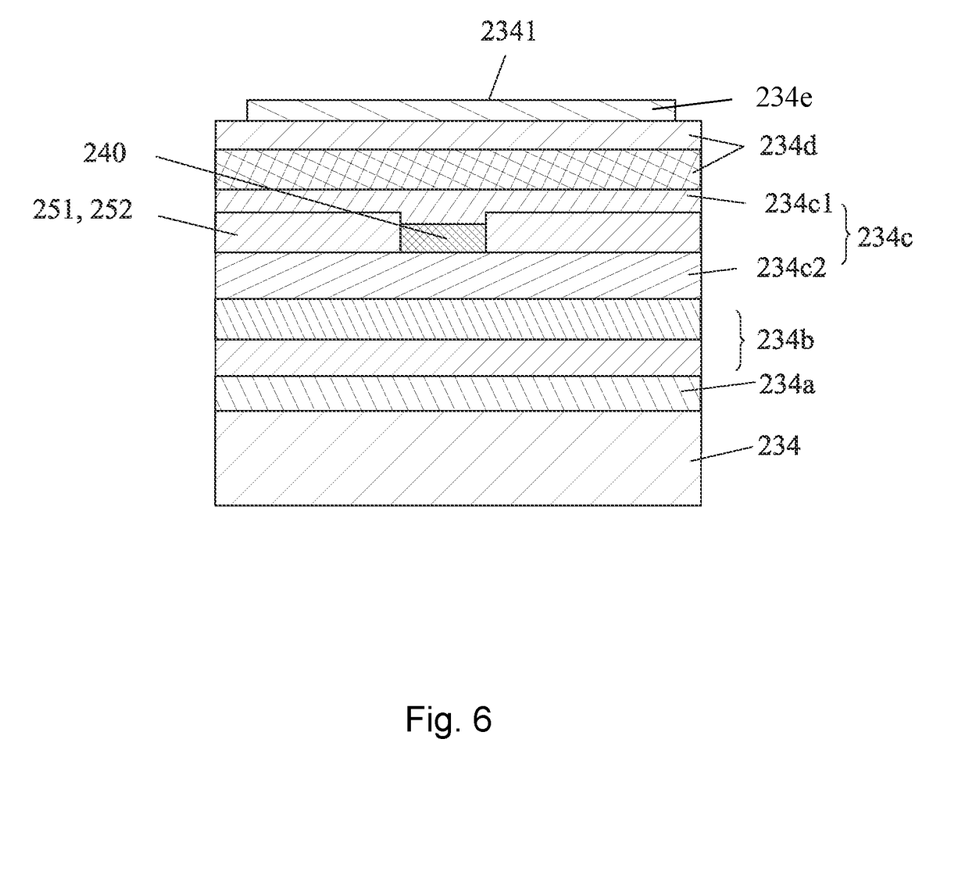
FIG. 6 shows a layer structure of the substrate member with the multiple layers formed thereon.
Figure 7:
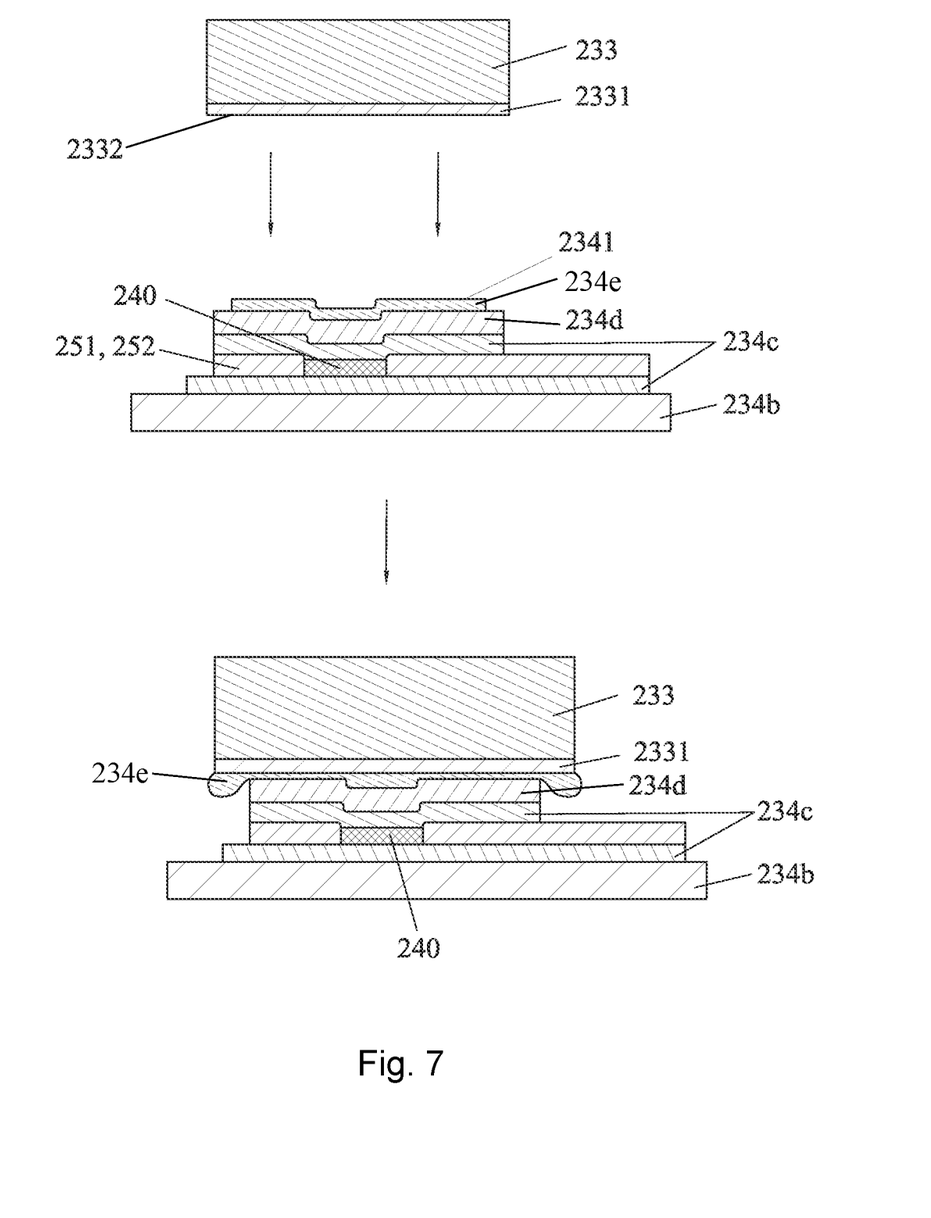
FIG. 7 shows a bonding process between the light source assembly and the substrate member according to an embodiment of the present invention.

As shown in FIGS. 5c and 6, the lead 251/252 is thicker than the heater 240, thereby a distance between the heater and the second bonding surface is farther than that between the lead and the second bonding surface, the first insulation layer 234c1 is covered on the surface of the heater 240, the buffer layer 234d is covered on the first insulation layer 234c1. During the assembling between the light source assembly 233 and substrate member 234, the second bonding layer 2331 of the light source assembly 233 is bonded to the first bonding layer 234e of the substrate member 234 by laser, since lead 251/252 is thicker than the heater 240, the mechanical bonding stress is generated not on the heater 240 but on the leads 251, 252, therefore preventing the light source assembly 233 from being damaged, furthermore, the heater 240 will not directly contact with the surface of the light source assembly 233, less IMC (Intermetallic compound microstructure) is formed on the surface of the heater 240, less thermal conduction will be generated between the light source assembly 233 and the heater 240, thereby improving the performance of the light source unit 232, finally improving the performance of the thermally-assisted magnetic head 230.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A light source unit for thermally-assisted magnetic head, comprising:
   a substrate member having a first bonding surface,
   a light source assembly attached on the first bonding surface of the substrate member and having a second bonding surface; and
   a heater circuit assembly formed within the substrate member, the heater circuit assembly having a heater formed within the substrate member and a first lead and a second lead connected at two ends of the heater,
   wherein the substrate member comprises a connection pad layer and an insulation layer including a first insulation layer and a second insulation layer,
   wherein the first lead, the second lead and the heater each are directly disposed on a same upper flat surface of the second insulation layer and directly sandwiched between the first insulation layer and the second insulation layer, and the first lead and the second lead each are thicker than the heater, thereby a distance between the heater and the second bonding surface is greater than that between the first lead and the second bonding surface and that between the second lead and the second bonding surface.

2. The light source unit according to claim 1, wherein the first bonding surface of the substrate member has a bonding area that is bonded to the light source assembly, and the heater is buried under the light source assembly and located within the bonding area.

3. The light source unit according to claim 1, wherein multiple layers are formed on the substrate member, and the substrate member further comprises a base layer, a buffer layer and a first bonding layer with the first bonding surface provided.

4. The light source unit according to claim 3, wherein a second bonding layer is formed on the light source assembly to provide the second bonding surface, and the second bonding layer is thinner than the first bonding layer.

5. The light source unit according to claim 1, wherein the second insulation layer is thicker than the first insulation layer, and thermal conductivity of the second insulation layer is lower than that of the first insulation layer.

6. The light source unit according to claim 5, wherein the first insulation layer is made of SiN or AlN, and the second insulation layer is made of $SiO_2$, SiN or $Al_2O_3$.

7. The light source unit according to claim 1, wherein the heater is made of tungsten or platinum.

8. A thermally-assisted magnetic head, comprising a slider body and a light source unit attached on a surface of the slider body, wherein the light source unit comprises:
   a substrate member having a first bonding surface,
   a light source assembly attached on the first bonding surface of the substrate member and having a second bonding surface; and
   a heater circuit assembly formed within the substrate member, the heater circuit assembly having a heater formed within the substrate member and a first lead and a second lead connected at two ends of the heater,
   wherein the substrate member comprises a connection pad layer and an insulation layer including a first insulation layer and a second insulation layer,
   wherein the first lead, the second lead and the heater each are directly disposed on a same upper flat surface of the second insulation layer and directly sandwiched between the first insulation layer and the second insulation layer, and the first lead and the second lead each are thicker than the heater, thereby a distance between the heater and the second bonding surface is greater than that between the first lead and the second bonding surface and that between the second lead and the second bonding surface.

* * * * *